(12) United States Patent
Stering et al.

(10) Patent No.: US 9,105,645 B2
(45) Date of Patent: Aug. 11, 2015

(54) METHOD FOR PRODUCING THIN SEMICONDUCTOR COMPONENTS

(71) Applicant: ams AG, Unterpremstätten (AT)

(72) Inventors: Bernhard Stering, Stainz (AT); Jörg Siegert, Graz (AT); Bernhard Löffler, Gleisdorf (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 14/352,676

(22) PCT Filed: Sep. 18, 2012

(86) PCT No.: PCT/EP2012/068344
§ 371 (c)(1),
(2) Date: Apr. 17, 2014

(87) PCT Pub. No.: WO2013/056936
PCT Pub. Date: Apr. 25, 2013

(65) Prior Publication Data
US 2014/0349462 A1 Nov. 27, 2014

(30) Foreign Application Priority Data
Oct. 19, 2011 (DE) .......... 10 2011 116 409

(51) Int. Cl.
*H01L 21/76* (2006.01)
*H01L 23/544* (2006.01)
(Continued)

(52) U.S. Cl.
CPC .......... *H01L 23/544* (2013.01); *H01L 21/6835* (2013.01); *H01L 21/76879* (2013.01); *H01L 21/76898* (2013.01); *H01L 21/6836* (2013.01); *H01L 2221/6834* (2013.01); *H01L 2221/68327* (2013.01); *H01L 2221/68377* (2013.01); *H01L 2924/0002* (2013.01)

(58) Field of Classification Search
CPC ................ H01L 21/76879; H01L 2221/68377
USPC .................................................. 438/401, 406
See application file for complete search history.

(56) References Cited

U.S. PATENT DOCUMENTS 5,753,529 A * 5/1998 Chang et al. ................... 438/118
5,770,487 A * 6/1998 Maas et al. ..................... 438/164

(Continued)

FOREIGN PATENT DOCUMENTS

DE      19856573 C1   5/2000
DE    102009036033 A1   2/2011
EP       2200074 A1    6/2010

*Primary Examiner* — Caridad Everhart
(74) *Attorney, Agent, or Firm* — McDermott Will & Emery LLP

(57) ABSTRACT

A semiconductor substrate (1) is provided with a structure (3) on an upper side (2), and an additional substrate (4) provided for handling the semiconductor substrate is likewise structured on an upper side (5). The structuring of the additional substrate takes place in at least partial correspondence with the structure of the semiconductor substrate. The structured upper sides of the semiconductor substrate and the additional substrate are positioned such that they face one another and are permanently connected to one another. Subsequently, the semiconductor substrate is thinned from the rear side (6), and the additional substrate is removed at least to such a degree that the structure of the semiconductor substrate is exposed to the extent required for the further use.

7 Claims, 3 Drawing Sheets

(51) Int. Cl.
*H01L 21/768* (2006.01)
*H01L 21/683* (2006.01)

(56) References Cited

U.S. PATENT DOCUMENTS

2002/0167072 A1* 11/2002 Andosca ................ 257/620
2004/0074865 A1* 4/2004 Ho et al. .................... 216/2
2004/0241899 A1 12/2004 Brissot et al.
2005/0212132 A1 9/2005 Hsuan et al.
2009/0321863 A1 12/2009 Borthakur et al.
2010/0155932 A1* 6/2010 Gambino et al. ........... 257/698
2011/0175236 A1 7/2011 Lou et al.
2011/0204462 A1 8/2011 Borthakur et al.

* cited by examiner

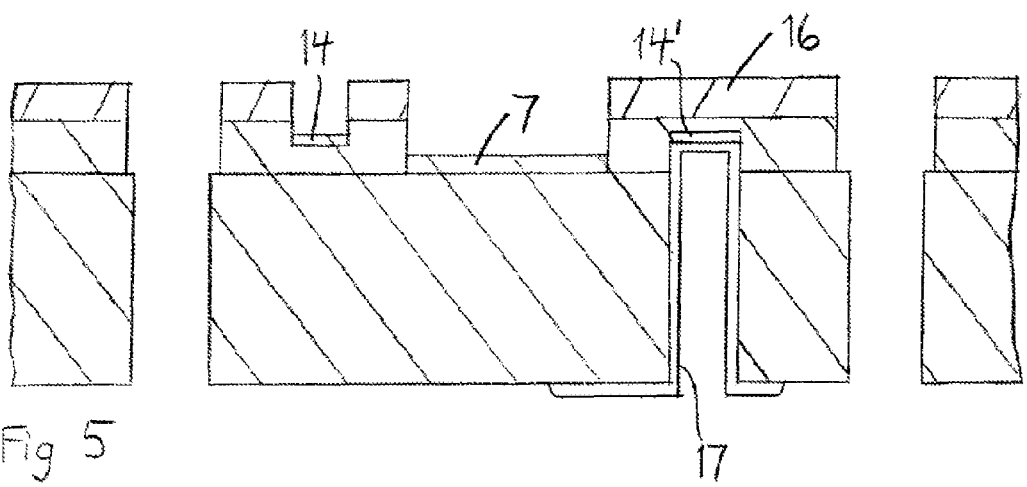
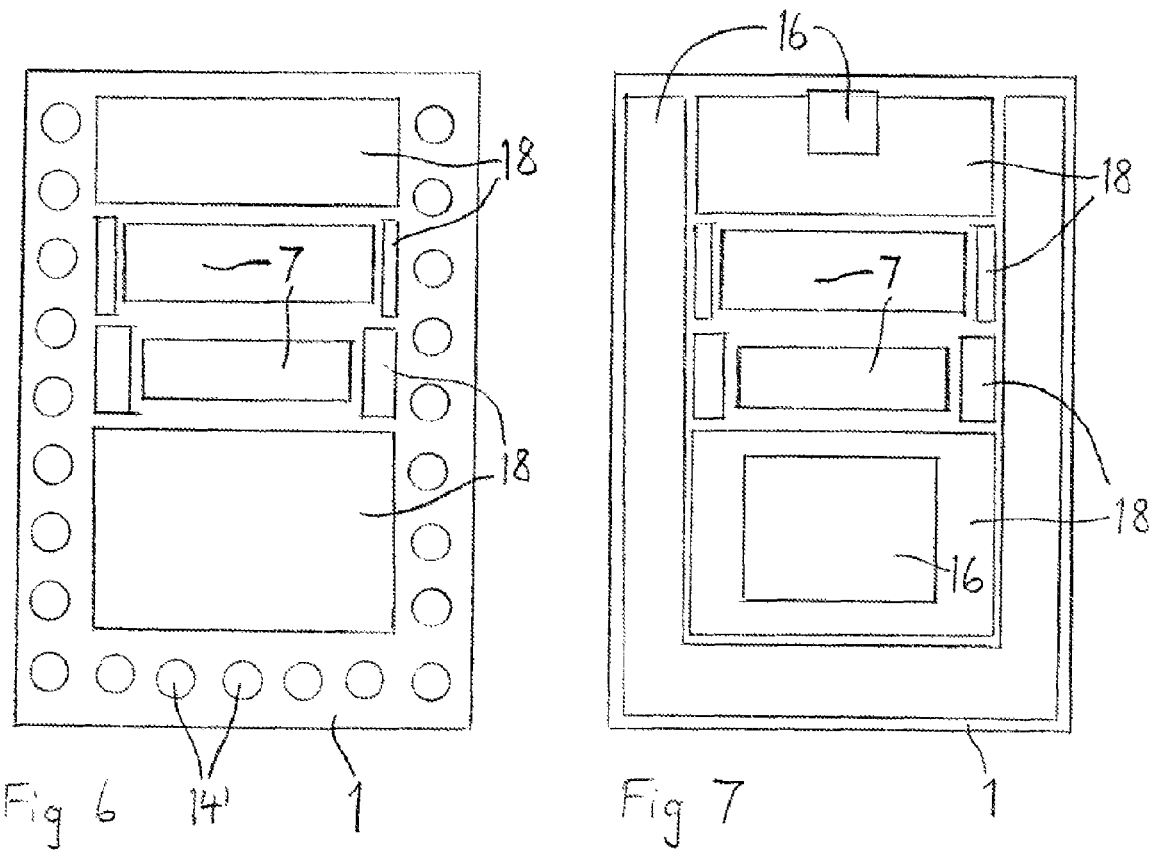

METHOD FOR PRODUCING THIN SEMICONDUCTOR COMPONENTS

DESCRIPTION

The present invention pertains to the production of thinned semiconductor devices by utilizing a handling wafer.

DE 10 2009 036 033 A1 describes an arrangement of a cover wafer and a base wafer that is intended for through-substrate vias. Before or after the connection to the base wafer, a continuous opening is produced in the cover wafer above a terminal pad that is provided with a globule of solder. The terminal pad may be realized in the form of an electric terminal of an electronic device or an integrated circuit of the base wafer. The cover wafer may consist of a silicon substrate and have a structure that is intended for one or more electronic devices or for an integrated circuit. The upper side of the cover wafer may be structured such that particularly the side facing the base wafer may be provided with recesses or the like. The upper side of the base wafer that faces the cover wafer and is covered by the cover wafer may also be provided with a surface structure. This makes it possible to realize a cavity in the connected wafers, in which a movable part of a micro-electromechanical device can be accommodated.

US 2005/0212132 A1 describes a chip package with a rigid cover. The cover is applied over an upper side of the chip that is provided with active components and may feature openings above terminal pads.

It is an object of the present invention to disclose a method for producing thin semiconductor devices that is compatible with the production of through-substrate vias.

This object is achieved with the method according to claim 1. Refinements derive from the dependent claims.

In the method, a semiconductor substrate is provided with a structure featuring a terminal pad on an upper side, and an additional substrate provided for handling the semiconductor substrate is likewise structured up to a maximum depth on an upper side without penetrating the additional substrate. The structuring of the additional substrate takes place in at least partial correspondence with the structure of the semiconductor substrate. The upper side of the additional substrate is realized flat in the region of the terminal pad. The structured upper sides of the semiconductor substrate and the additional substrate are positioned such that they face one another and are permanently connected to one another. Subsequently, the semiconductor substrate is thinned from the rear side that faces away from the upper side. After the thinning of the semiconductor substrate, a contact hole to the terminal pad is produced from the rear side and a through-substrate via is produced in the contact hole, wherein the through-substrate via is connected to the terminal pad and does not fill the contact hole. The additional substrate is removed at least to such a degree that the structure of the semiconductor substrate is exposed to the extent required for the further use, but a remaining portion of the additional substrate stays on the side of the terminal pad that faces away from the through-substrate via and mechanically stabilizes the terminal pad.

In an embodiment of the method, the structure on the upper side of the semiconductor substrate features a component of a device and a recess produced on top of this component. The upper side of the additional substrate is provided with an additional recess that is arranged in correspondence with the aforementioned recess. In another embodiment, the component is provided for a sensor, and the recess and the additional recess form a cavity in which the sensor is accommodated.

In another embodiment of the method, the structure on the upper side of the semiconductor substrate is realized in the form of a CMOS circuit.

In another embodiment of the method, the structure of the semiconductor substrate is realized in the form of a saw street, and the upper side of the additional substrate is provided with a trench that extends in correspondence with the saw street.

In another embodiment of the method, an additional trench that extends as far as the saw street is produced in the semiconductor substrate from the rear side after the thinning of the semiconductor substrate and before the at least partial removal of the additional substrate. The additional trench serves for separating the chips from the wafer.

In another embodiment of the method, the upper side of the additional substrate is structured up to a maximum depth in the range from 30 µm to 50 µm.

Examples of the production method are described in greater detail below with reference to the attached figures.

FIG. 5 shows an arrangement according to FIG. 4 after the separation of the devices.

FIG. 6 shows a section of a semiconductor substrate with components of devices in a top view.

FIG. 7 shows a top view according to FIG. 6 after additional production steps carried out by utilizing the handling wafer.

Figure 1:
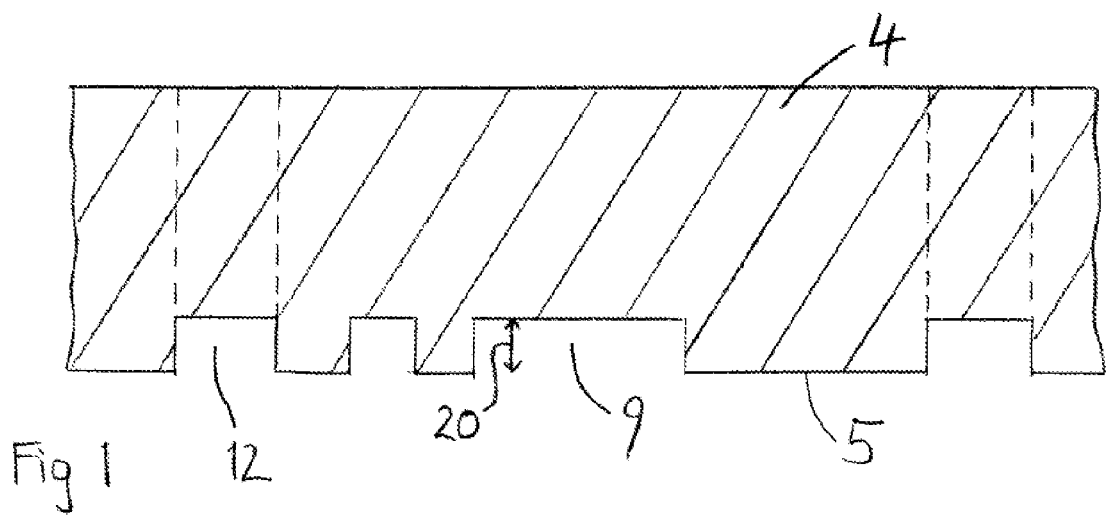
FIG. 1 shows a section of a handling wafer with a structured upper side in a cross section.
Figure 2:
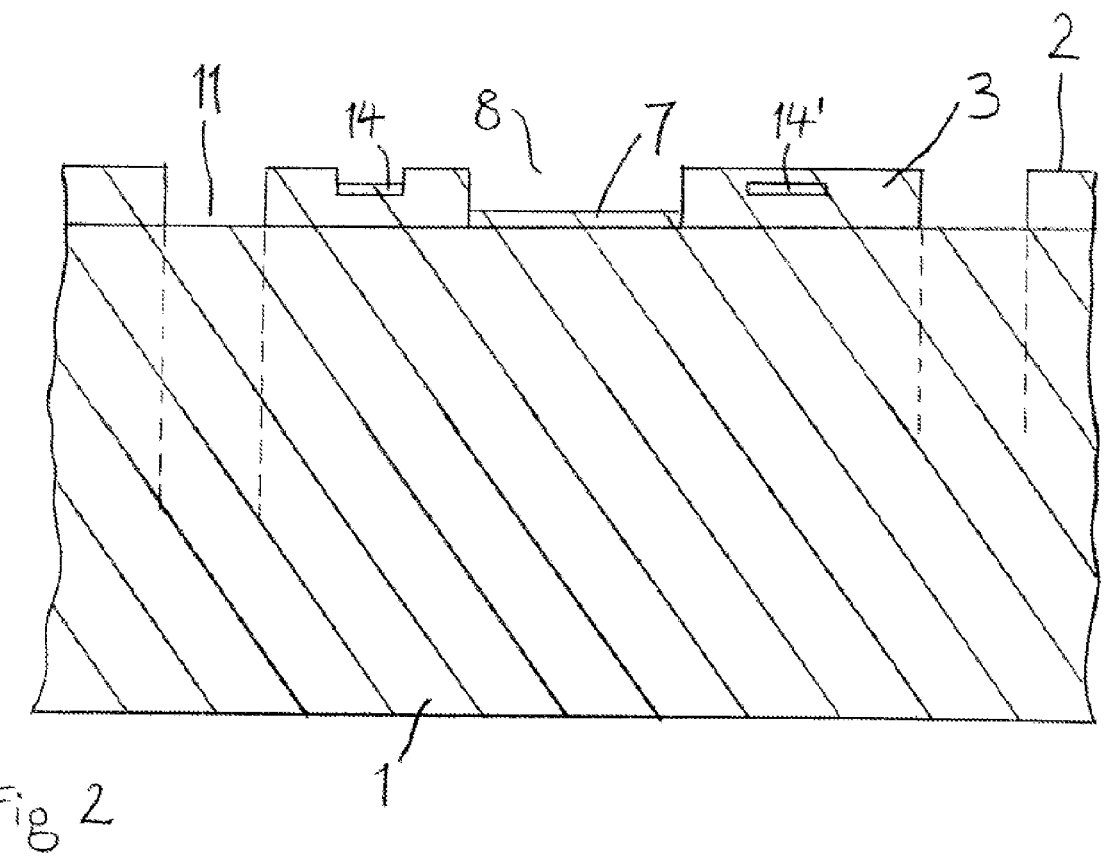
FIG. 2 shows a section of a semiconductor substrate with a structure on its upper side in a cross section.

FIG. 1 shows a cross-sectional representation of a section of a substrate 4 that is used for handling a semiconductor substrate 1 of the type illustrated in the form of a cross-sectional representation in FIG. 2. In order to distinguish the substrate 4 according to FIG. 1 from the semiconductor substrate 1, it is referred to as additional substrate 4 below. The additional substrate 4 may be, in particular, an additional semiconductor substrate in the form of a so-called handling wafer. The semiconductor substrate 1 according to FIG. 2 serves for the production of a plurality of chips and is provided with a structure 3, for example, in the form of a CMOS circuit on an upper side 2. The figures respectively show a section that comprises slightly more than one chip.

On an upper side 5 that is directed downward in FIG. 1, the additional substrate 4 is provided with a corresponding structure that extends to a typical depth 20 of 30 µm to 50 µm and does not penetrate the additional substrate 4 up to its rear side, but in comparison with the thickness of the additional substrate 4 preferably occupies only a thin layer portion on the upper side as illustrated in FIG. 1. The structuring of the additional substrate 4 is carried out, for example, by means of DRIE (deep reactive ion etching), in which an etching mask is utilized. In this case, the structure 3 of the semiconductor substrate 1 can be copied in a completely mirror-symmetrical fashion. Alternatively, it may suffice if only individual structural elements are transferred into the additional substrate 4 and the structure of the additional substrate 4 only corresponds partially to the structure 3 of the semiconductor substrate 1.

The structure 3 on the upper side of the semiconductor substrate 1 can feature any active or passive components of an electronic circuit that may be arranged within the semiconductor material or also in one or more layers of semiconductor material or dielectric applied thereon. It would be possible, in particular, to provide an exposed component 7 of a device such as, for example, a sensor with a recess 8 arranged on top thereof in a layer of the structure 3 or a terminal pad 14 that is exposed or buried in a layer of the structure 3. The component 7 may be a layer of a photodiode, for example.

In the section of the semiconductor substrate 1 shown in FIG. 2, a component 7 of a device and two terminal pads 14, 14' are illustrated as examples for one of the chips. The terminal pads 14, 14' may be realized, in particular, in a metallization plane of a wiring. The details of the design of the structure 3 are not essential for the method and are therefore not discussed in greater detail.

According to a preferred embodiment of the method, it is proposed to provide the upper side 2 of the semiconductor substrate 1 with a saw street 11, for example, in the form of a double grid. The saw street 11 marks the region in which the semiconductor substrate 1 is severed and separated into the individual chips in subsequent production steps. The saw street 11 may be provided, in particular, with a trench produced in a layer of the structure 3 as illustrated in FIG. 2.

In the embodiment of the additional substrate 4 according to FIG. 1, additional recesses 9 that correspond to the recesses 8 in the structure 3 of the semiconductor substrate 1, as well as a trench 12 that extends in correspondence with the saw street 11, have been produced. In this embodiment it is in evidence that a corresponding recess in the upper side 5 of the additional substrate 4 was not produced for each terminal pad 14, 14' of the structure 3 of the semiconductor substrate 1. A recess is situated in the additional substrate 4 above the terminal pad 14 drawn on the left side, while the flat surface 5 of the additional substrate 4 remained unstructured above the terminal pad 14' drawn on the right side.

The structured upper sides 2, 5 of the semiconductor substrate 1 and the additional substrate 4 are positioned such that they face one another and are permanently connected to one another. This is realized by means of conventional connecting techniques, namely so-called bonding processes, in which a separately produced connecting oxide layer may be utilized, if so required. Corresponding recesses provided in the structured upper sides 2, 5 can at least partially complement one another, and in this way form larger cavities between the substrates 1, 4.

Figure 3:
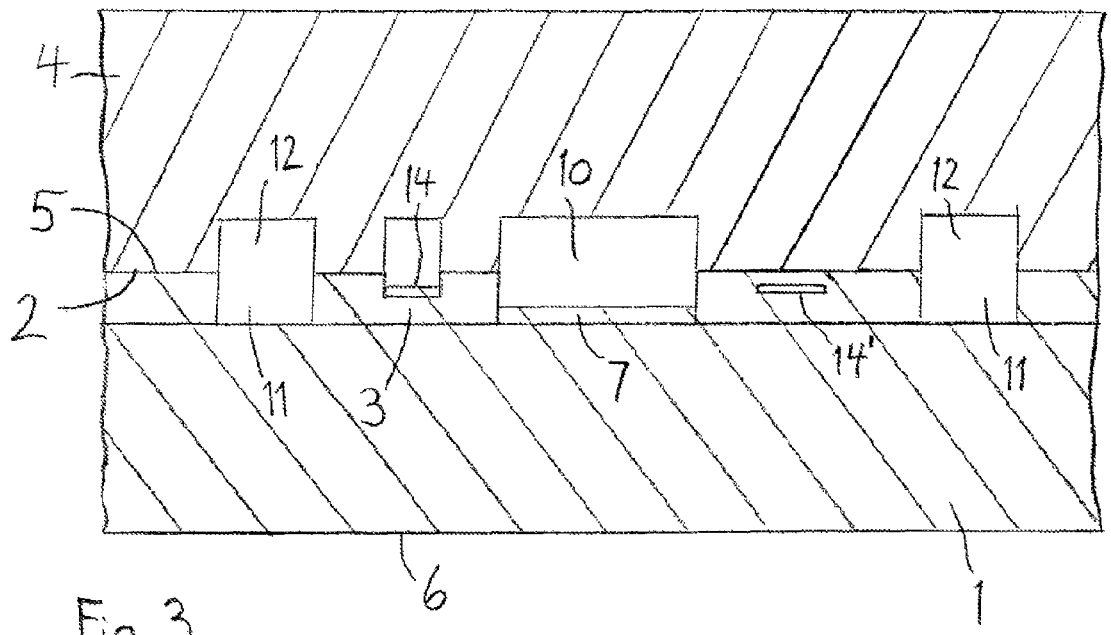
FIG. 3 shows a section of an arrangement of the handling wafer on the semiconductor substrate in a cross section.

A section of the arrangement produced due to the connection of the substrates 1, 4 is illustrated in the form of a cross-sectional representation in FIG. 3. The recesses 8 and the additional recesses 9 respectively form a cavity 10 above the respective component 7 of the device that consists of a sensor component in the described example. Additional cavities may be provided above the remaining regions of the structure 3 that are provided with recesses such as, for example, above the terminal pad 14 drawn on the left side in FIG. 3. The saw street 11 likewise forms a cavity together with the corresponding trench 12 of the additional substrate 4.

Figure 4:
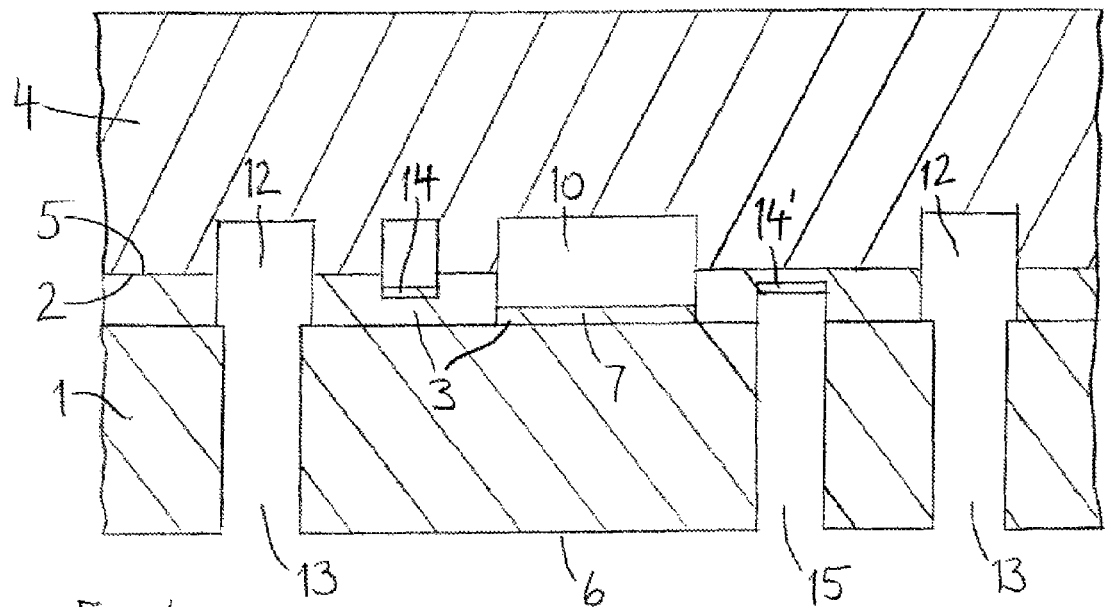
FIG. 4 shows an arrangement according to FIG. 3 after the etching of separation trenches and through-substrate vias.

After this arrangement has been produced, the semiconductor substrate 1 is thinned from the rear side 6. In this way, the semiconductor substrate 1 can be provided with a residual thickness of less than 250 µm, typically less than 200 µm. The thinning is realized conventionally such as, for example, by means of back-grinding or back-etching or even a combination of these processes, particularly by means of back-grinding until the desired thickness is almost reached and subsequent etching to the desired thickness, wherein a sufficiently smooth outer surface is produced on the rear side. FIG. 4 shows a cross-sectional representation according to FIG. 3 after an additional trench 13 has been produced in the semiconductor substrate 1, particularly etched by means of DRIE, from the rear side 6 in the region of the saw street. In the embodiment shown, contact holes 15 to the terminal pads 14' were also etched. The contact holes are provided for the production of so-called through-substrate vias. The trench 13 and the contact holes 15 may be produced independently of one another or even omitted.

FIG. 5 shows the arrangement according to FIG. 4 after a through-substrate via 17 was produced in the contact hole 15 and the additional substrate 4 was thinned and almost completely removed. The through-substrate via 17 is connected to the terminal pad 14' and does not fill the contact hole 15. The structuring of the additional substrate 4 serves for ensuring that the structure 3 of the semiconductor substrate 1 is exposed to the extent required for the further use of the chips. The remaining portion 16 of the additional substrate 4 has a thickness that is smaller than the maximum depth 20 of the structuring such that the component 7 realized, for example, in the form of a sensor and the terminal pad 14 exposed on the upper side are not covered by the remaining portion 16 of the additional substrate 4.

The terminal pad 14' provided for the through-substrate via 17 stays covered by the remaining portion 16 of the additional substrate 4 such that this terminal pad 14' is mechanically stabilized in the upward direction. If the terminal pads 14' of the through-substrate vias 17 are also electrically connected directly on the upper side, corresponding recesses may be provided in the additional substrate 4 at the respective locations (as is the case with the terminal pad 14 drawn on the left side).

If a trench 13 is produced in the semiconductor substrate 1 along the saw street 11, as is the case in the described embodiment, the chips are already separated due to the thinning or removal of the additional substrate 4 as indicated in FIG. 5. In order to improve the handling of the arrangement during the thinning of the additional substrate 4, a tape (grinding tape) or a film may be temporarily fixed on the rear side 6 of the semiconductor substrate 1, preferably in an adhesive fashion.

In order to further elucidate the method, FIGS. 6 and 7 respectively show a top view of the chip of a semiconductor substrate 1 before and after the thinning process. As an example, FIG. 6 schematically shows terminal pads 14' for various through-substrate vias, active regions 18 and components 7 such as, for example, photodiodes. The structured additional substrate 4 is fixed on this structure 3. The majority of the additional substrate 4 is removed after the semiconductor substrate 1 has been thinned from the rear side. Only the remaining portions 16 of the additional substrate 4 illustrated in FIG. 7 persist. In the example illustrated in FIG. 7, the terminal pads 14' stay covered by the remaining portion 16 of the additional substrate 4 such that the terminal pads 14', which may be connected to through-substrate vias from the rear side, are mechanically stabilized.

The method has a number of advantages. A conventional bonding process, in which an oxide connecting layer is utilized, can be used in the method such that high process temperatures can be realized. The removal of the handling wafer is significantly simplified because it is not necessary to carry out a sequence of back-grinding and back-etching steps, in which etch stop layers are utilized, but a structured layer portion of the handling wafer connected to the semiconductor substrate rather can remain on the semiconductor substrate. Consequently, the method is compatible with the utilization of sensitive layers in the active region, particularly for sensors. Due to the utilization of the additional substrate, the thinning of the semiconductor substrate can be carried out without the risk of fractures. A structuring of the substrates especially for or in addition to the definition of the saw street makes it possible to reduce the area of the saw street and to realize a separation by means of trench etching such that wafer base material is saved and the production costs are reduced.

LIST OF REFERENCE SYMBOLS

1 Semiconductor substrate
2 Upper side of the semiconductor substrate
3 Structure of the upper side of the semiconductor substrate
4 Additional substrate
5 Upper side of the additional substrate
6 Rear side of the semiconductor substrate
7 Component of a device
8 Recess
9 Additional recess
10 Cavity
11 Saw street
12 Trench in the additional substrate
13 Additional trench in the semiconductor substrate
14 Terminal pad for terminal on the upper side
14' Terminal pad for through-substrate via
15 Contact hole
16 Remaining portion of the additional substrate
17 Through-substrate via
18 Active region
20 Maximum depth

The invention claimed is:

1. A method for producing thin semiconductor devices, comprising:
   providing a semiconductor substrate with a structure featuring a terminal pad on an upper side of the semiconductor substrate,
   providing an additional substrate for handling the semiconductor substrate, the additional substrate being structured on an upper side to a maximum depth and in at least partial correspondence with the structure of the semiconductor substrate, without penetrating the additional substrate, the upper side of the additional substrate being flat in a region of the terminal pad,
   the upper sides of the semiconductor substrate and the additional substrate being permanently connected to one another,
   the semiconductor substrate being thinned from a rear side facing away from the upper side,
   a contact hole to the terminal pad being produced from the rear side after the thinning of the semiconductor substrate, and a through-substrate via being produced in the contact hole and connected to the terminal pad without filling the contact hole, and
   the additional substrate being removed at least to such a degree that the structure is exposed, a remaining portion of the additional substrate being maintained on the side of the terminal pad that faces away from the through-substrate via and mechanically stabilizing the terminal pad.

2. The method according to claim 1, further comprising:
   the structure on the upper side of the semiconductor substrate being provided with a component of a device,
   a recess being produced above said component, and
   the upper side of the additional substrate being provided with an additional recess arranged in correspondence with said recess.

3. The method according to claim 2, wherein
   the component is provided for a sensor, and the recess and the additional recess form a cavity in which the sensor is accommodated.

4. The method according to one of claims 1 to 3, wherein
   the structure on the upper side of the semiconductor substrate is formed as a CMOS circuit.

5. The method according to one of claims 1 to 3, wherein
   the structure on the upper side of the semiconductor substrate forms a saw street, and
   the upper side of the additional substrate is provided with a trench extending according to the saw street.

6. The method according to claim 5, wherein
   after the thinning of the semiconductor substrate and before the partial removal of the additional substrate, an additional trench extending as far as the saw street is produced in the semiconductor substrate from the rear side.

7. The method according to one of claims 1 to 3, wherein
   the upper side of the additional substrate is structured up to a maximum depth in the range from 30 µm to 50 µm.

* * * * *